US008260989B2

(12) United States Patent
Etkin et al.

(10) Patent No.: US 8,260,989 B2
(45) Date of Patent: Sep. 4, 2012

(54) METHOD AND SYSTEM FOR LOW-POWERED DATA TRANSMISSION

(75) Inventors: Raul Hernan Etkin, Mountain View, CA (US); Erik Ordentlich, San Jose, CA (US); Gadiel Seroussi, Cupertino, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 94 days.

(21) Appl. No.: 12/859,199

(22) Filed: Aug. 18, 2010

(65) Prior Publication Data

US 2012/0047378 A1 Feb. 23, 2012

(51) Int. Cl.
*G06F 13/38* (2006.01)
(52) U.S. Cl. ........................................................ 710/68
(58) Field of Classification Search .................. None
See application file for complete search history.

(56) References Cited

U.S. PATENT DOCUMENTS

| | | | | |
|---|---|---|---|---|
| 5,512,921 | A * | 4/1996 | Mital et al. ..................... | 345/555 |
| 7,098,822 | B2 * | 8/2006 | Augenstein et al. ............ | 341/87 |
| 2006/0220839 | A1 * | 10/2006 | Fifolt et al. .............. | 340/539.12 |
| 2008/0143822 | A1 * | 6/2008 | Wang et al. ..................... | 348/36 |
| 2009/0082919 | A1 * | 3/2009 | Hershey et al. ................. | 701/35 |

FOREIGN PATENT DOCUMENTS

CN 101420740 A 4/2009

OTHER PUBLICATIONS

Petrovic, D.; Shah, R.C.; Ramchandran, K.; Rabaey, J.; , "Data funneling: routing with aggregation and compression for wireless sensor networks," Sensor Network Protocols and Applications, 2003. Proceedings of the First IEEE. 2003 IEEE International Workshop on , vol., no., pp. 156-162, May 11, 2003.*
Marcelloni, F.; Vecchio, M.; , "A Simple Algorithm for Data Compression in Wireless Sensor Networks," Communications Letters, IEEE , vol. 12, No. 6, pp. 411-413, Jun. 2008.*
Wu-Chi Feng, Ed Kaiser, Wu Chang Feng, and Mikael Le Baillif. 2005. Panoptes: scalable low-power video sensor networking technologies. ACM Trans. Multimedia Comput. Commun. Appl. 1, 2 (May 2005), 151-167.*
Ying, Beihua et al., "energy-efficient Node-level Compression Arbitration for Wireless Sensor Networks", 863 Project of China, 2006.
Sharma, Abhishek B., et al., "Dynamic Data Compression in Multihop Wireless Networks", Sigmetrics/Performace '09, Jun. 15-19, 2009, Seattle, WA.

(Continued)

*Primary Examiner* — Chun-Kuan Lee
*Assistant Examiner* — Dayton Lewis-Taylor (57) ABSTRACT

One embodiment of the present invention is a sensor comprising one or more sensing devices, data-transmission components that transmit sensor data to a receiving component, and a processing component. The processing component executes routines to record sensing-device output as data for transmission to the receiving entity and to control the data-transmission components to transmit the data to the receiving entity. The processing component executes one or more compressing routines to compress data prior to transmission, when data compression is estimated to result in a lower power cost than transmitting uncompressed data, and controlling the data-transmission components to transmit data without compressing the data when data compression is estimated to result in a higher power cost than transmitting uncompressed data.

19 Claims, 6 Drawing Sheets

OTHER PUBLICATIONS

Liang, Yao, et al., "Minimizing Energy consumptions in Wireless Networks via Two-Modal Transmission", ACM SIGCOMM Computer Communication Review, pp. 12-18, vol. 40, No. 1, Jan. 2010.

Chohan, Navraj, "Compression Offloading for Wireless Sensor Networks", Literary Survey.

Santini, Silvia, et al., "An Adaptive Strategy for Quality-Based Data Reduction in Wireless Sensor Networks", Institute for Pervasive Computing.

Chohan, Navraj, "Hardware Assisted Compression in Wireless Sensor Networks", Dept. of Computer Engineering and Computer Science, University of California, Santa Barbara.

* cited by examiner

METHOD AND SYSTEM FOR LOW-POWERED DATA TRANSMISSION

TECHNICAL FIELD

Certain embodiments of the present invention are directed methods and systems for low-power data transmission that conserve power by selectively compressing data prior to transmission.

BACKGROUND

Many different types of data compression have been developed during the past half century to facilitate electronic data transmission and electronic data storage. Many data-compression methods are lossless, in that, absent errors, decompression of data compressed by lossless compression techniques returns the original data. Many other compression methods are referred to as "lossy," because the methods obtain compression at the expense of loss of a portion of the original information content of the data that is compressed. Examples of lossless data compression include various types of entropy coding, including Huffman encoding and run-length encoding, which more efficiently encode the original data. Examples of lossy compression methods include the quantization of transform coefficients and resolution-decimation steps undertaken in MPEG compression of video signals.

Many of the well-known data-compression techniques can be used to compress data or a data stream prior to transmission from a data source to a receiving entity. These compression techniques generally seek to identify and remove redundant data from a given signal or stream and/or to remove unneeded information from the data signal or data stream, and, by doing so, reduce the amount of data transmitted from the data source to the receiving entity. Data compression can therefore increase communications bandwidths and decrease data-transmission overheads and delays at the expense of the computational overhead of compression, on the data-source side, and the computational expense of compressed-data decompression, on the receiving-entity side. In many distributed systems, the computational bandwidth may greatly exceed the data-transmission bandwidth, so that data-compression produces increased data-transmission bandwidth with negligible cost Networks of low-power-consuming sensors represent a new type of distributed computing system. The low-powered sensors have significantly different characteristics and constraints than personal computers in a networked-computer system, as a result of which methods used advantageously in distributed computer networks may not provide the same advantages in low-power-consuming sensor networks. Designers, manufacturers, and users of sensors therefore continue to seek to improve and extend sensor capabilities by using sensor-applicable methods.

DETAILED DESCRIPTION

Method and system embodiments of the present invention are directed to managing and minimizing power consumption associated with data transmission within any of a large variety of different types of distributed computing systems, including networks of low-power sensors. Sensors may attempt to decrease power consumed by data transmission by compressing data prior to transmission. In many cases, data compression produces much smaller amounts of compressed data that are equivalent to corresponding larger amounts of uncompressed data, and the power consumed by the processing elements of the sensor to compress the data is more than offset by reductions in the power consumption of data-transmission components obtained by transmitting smaller amounts of compressed data. However, as is well known in the data-compression field, data-compression algorithms may, when applied to certain types of data, either fail to compress the data to a significant degree or, in certain cases, actually produce a larger amount of "compressed" data than the original data to which the compression method was applied. Thus, over a long transmission, the power consumed in compressing data may, on average, be more than offset by reductions in the power consumed by transmitting smaller amounts of compressed data than transmitting corresponding, larger amounts of uncompressed data, but, when considered over shorter periods of time, the power consumed in data compression may not be offset by lower power-consumption in transmitting data for data being transmitted during certain of the shorter periods of time during which data compression is not sufficiently effective.

Method and system embodiments of the present invention are directed to identifying those periods of time in which data compression is not sufficiently effective to result in lower over-all power consumption for data transmission and to avoiding applying data compression during those identified periods of time. Unfortunately, the cost, in power, of precisely identifying those periods of time during which data compression is insufficiently effective need also be considered. Certain embodiments of the present invention employ methods that provide reasonable estimates of those periods of time in which application of data compression is not justified in order to avoid applying compressing during those times estimated to be disadvantageous for application of data compression. The power cost of precisely determining when data compression is not sufficiently effective to be justified would, in general, outweigh any power-consumption savings obtained by avoiding application of data compression during those precisely determined time periods, since, to precisely determine the periods of time, or data, for which compression is not sufficiently effective would involve always compressing the data.

In general, while it is convenient, for discussion, to consider periods of time during which application of compression is justified and not justified, the effectiveness of the application of data compression is generally determined by the characteristics of the data to which compression is applied. In many sensor applications, data is continuously recorded or recorded intermittently at regular intervals and more or less continuously transmitted from sensors to sensor routers and other sensor-data-collection entities, and therefore the data to which compression methodologies can be effectively applied correspond to particular periods of time within the time during which the sensors operate. Moreover, the characteristics of the data transmitted by sensors are likely to vary with time, as well.

Figure 1:
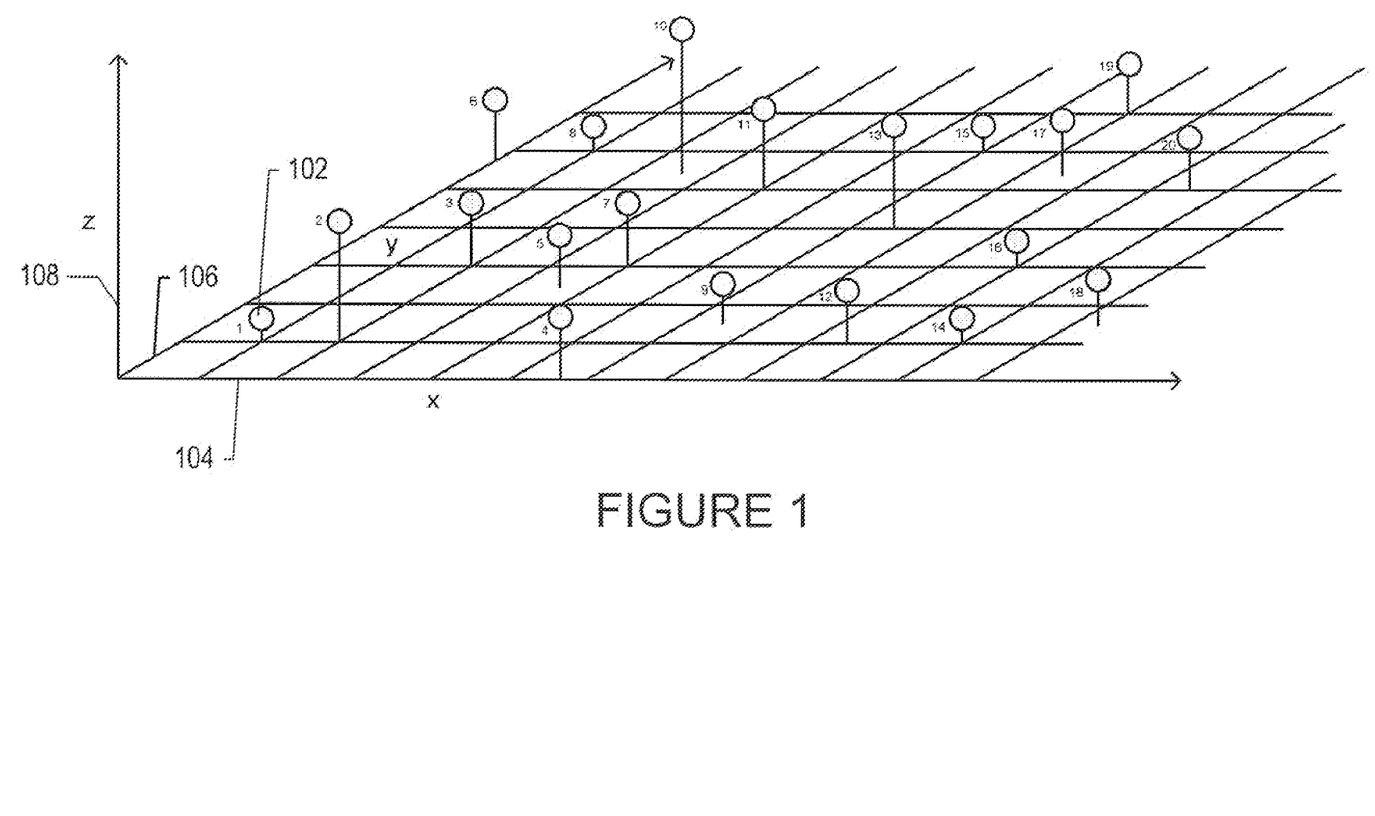
FIG. 1 illustrates an example distributed-sensor network.

FIG. 1 illustrates an example distributed-sensor network. In FIG. 1, each sensor is represented by a shaded disk, such as shaded disk 102. The sensors are distributed through a three-dimensional Cartesian space, as indicated by the mutually orthogonal Cartesian axes x 104, y 106, and z 108. Thus, each sensor has a position within the three-dimensional Cartesian space at any given point of time. In many applications of distributed-sensor networks, the positions of the sensors are fixed. However, in other distributed-sensor networks, the positions may vary, over time. For example, a network of seismic sensors may be distributed over a geographical region, each sensor located at a particular point in the region, and each sensor recording acceleration with respect to multiple axes, over time, to allow the locations and magnitudes of seismic events to be determined from sensor-reported data. Alternatively, the sensors may report data recorded during planned seismic events, such as test explosions or mechanical shocks, in order to construct images of subterranean features. In yet another example, sensors may be attached to animals within a geographical region in order to monitor behavior and interaction of the animals, attached to vehicles to study traffic flows, and applied to many other problem domains.

Sensors may generate continuous, one- or two-dimensional analog signals such as a displacement or acceleration along one directional axis versus time. Using the example of a distributed-seismic-sensor network, the signal may represent change in position, speed, or acceleration of the sensor with respect to time. Small clusters of wave forms within such a signal may represent, for example, sensor responses to earth movement generated by earthquakes or test explosions. The signals are generally recorded and encoded digitally, as floating-point values measured at particular points in time. Many different types of signals may be generated, recorded, and transmitted by sensors. For example, a sensor based on a three-axis accelerometer may record acceleration in three, mutually orthogonal directions, producing three different, time-aligned two-dimensional signals or, alternatively, a signal comprising the element values of a three-element vector measured and recorded at discrete points in time. These signals may be continuously recorded and discretized by the sensors, in value and in time, or, alternatively, may be discrete signals corresponding to measurements made at specific points in time.

Figure 2:
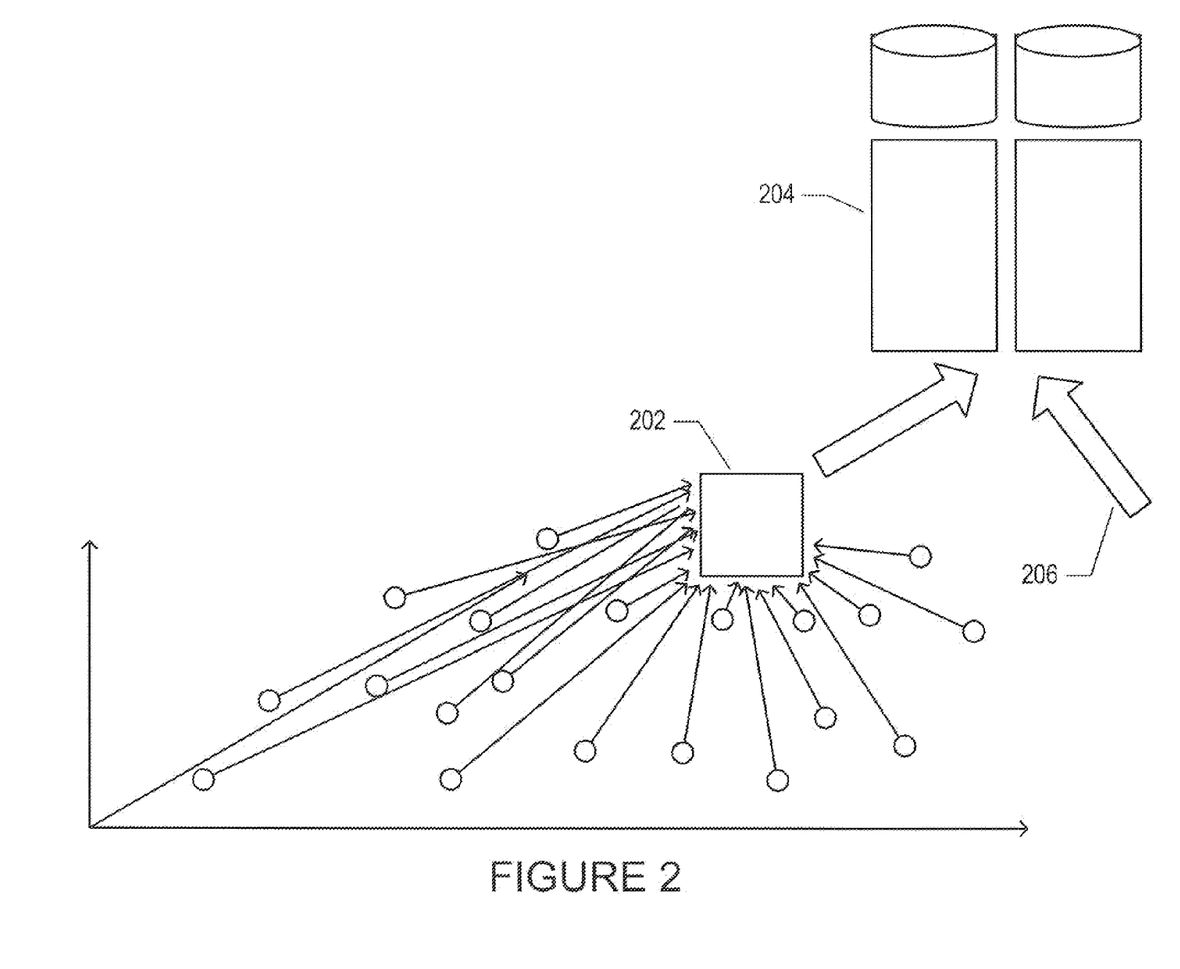
FIG. 2 illustrates data transfer from a distributed-sensor network to a remote data-storage and signal-processing facility.

FIG. 2 illustrates data transfer from a distributed-sensor network to a remote data-storage and signal-processing facility. In FIG. 2, the sensors of the example distributed-sensor network, shown in FIG. 1 are illustrated transmitting recorded sensor data to a sensor router 202 which, in turn, transmits the accumulated sensor data to a remote data-storage and signal-processing facility 204. Often, one or more additional sensor routers may concurrently transmit 206 accumulated sensor data from other distributed-sensor networks to the data-storage and signal-processing facility 204. Alternatively, sensors may transmit data directly to the data-storage and signal-processing facility. In the following discussion, the destination of data transmitted by sensors is referred to as a "receiving entity."

There are a variety of different methods by which the sensor data can be transmitted through the sensor router 202 to the remote data-storage and signal-processing facility. Perhaps the most simply implemented method is for the sensor router to simply collect data received from the sensors and forward the data, as a stream of sensor data or data messages, to the remote data-storage and signal-processing facility. To further increase data-transmission efficiency, various types of well-known data-compression can be carried out in order to reduce data-transmission overheads. For example, each individual sensor may employ data compression techniques to compress the sensor data transmitted by the sensor to the sensor router.

Figure 3:
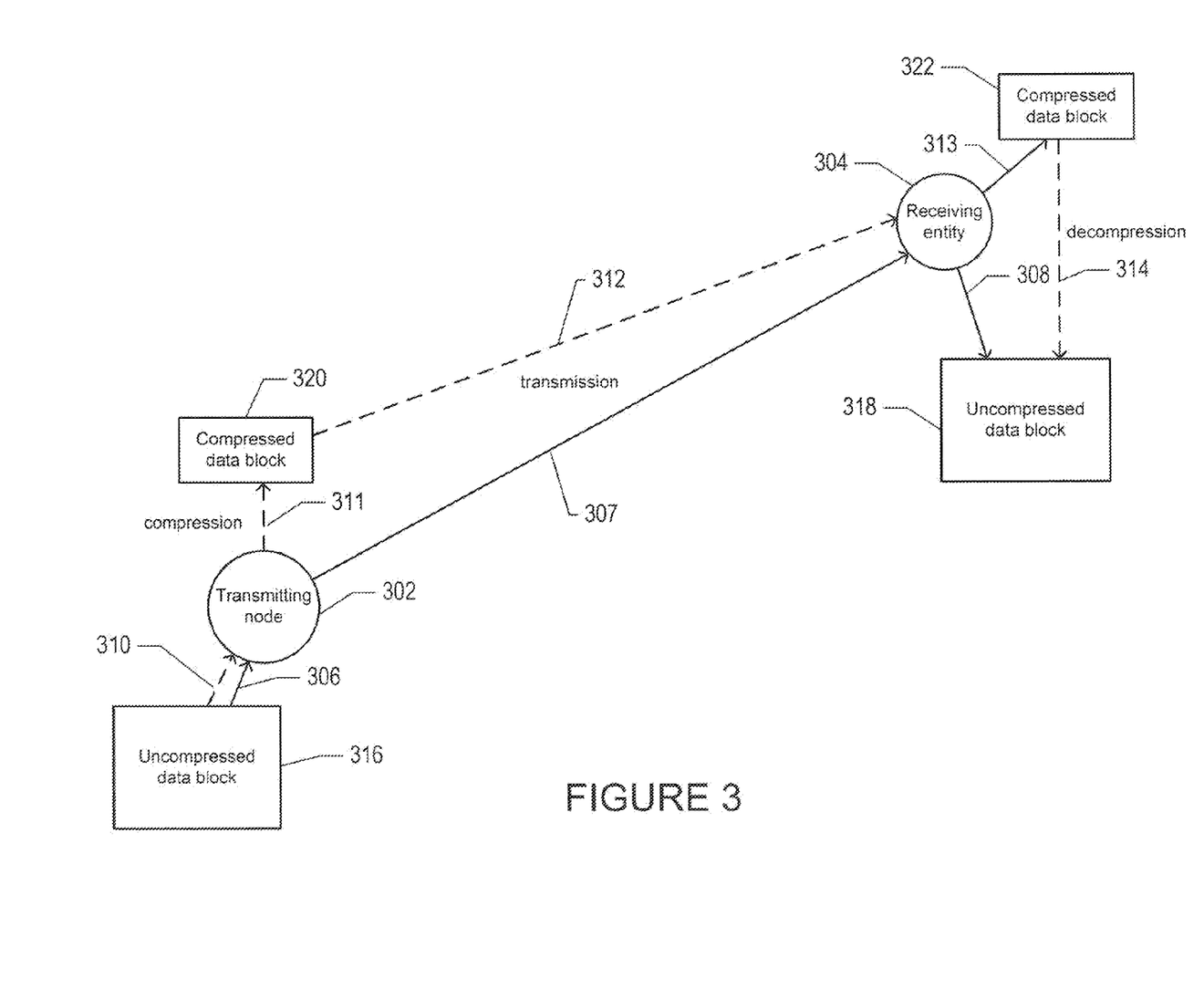
FIG. 3 illustrates two different methods, or paths, by which data can be transmitted from a sensor to a sensor router or other receiving entity.

FIG. 3 illustrates two different methods, or paths, by which data can be transmitted from a sensor to a sensor router or other receiving entity. In FIG. 3, the sensor is represented by disk 302 and the receiving entity is represented by disk 304. The first method, or path, is described by solid arrows 306-308 and the second method, or path, is depicted by dashed arrows 310-314. In the first method or path, uncompressed data 316 is recorded by the transmitting node and transmitted, using an electronic communications functionality, such as a wireless transmitter, optical transmitter, wire-based electronic data transmission, or another data-transmission functionality, 307, to the receiving entity 304 which generally stores 308 the uncompressed data 318 in memory or on a mass-storage device for subsequent processing. In a second method, or path, the uncompressed data 316 recorded by the sensor is compressed, using any of various different types of data-compression methods, to produce a corresponding compressed data block 320. Then, the compressed data is transmitted 312 by the data-transmitting functionality, to the receiving node 304, which generally stores the received compressed data 322 in memory and later may apply a decompression method corresponding to the compression method by which the sensor compressed the data 314 to produce the original uncompressed data which is stored in memory or on a mass-storage device 318. In the following discussion, the non-data-compression-based transmission method, or path, is referred to as "path 1" while the data-compression-based transmission method is referred to as "path 2."

A power cost can be assigned to the two different paths, or methods, by which data is transmitted from a sensor to a receiver, as discussed above with reference to FIG. 3. In general, it is assumed, in the following discussion, that the power cost of data decompression by the receiving entity is relatively unimportant, since, in general, receiving entities generally have ample power supplies and large computational bandwidths. By contrast, sensors are often constrained by relatively low levels of available power for computation and data transmission. The power cost for transmission of the message by the first path, path 1, discussed above with reference to FIG. 3, can be described as:

$$C_{path1} = C_{tran/bit} \cdot B_{total}$$

where $C_{path1}$ is the total power cost of transmitting the message via path 1;

$C_{trans/bit}$ is the transmission power cost, per bit, of transmitting the message to a receiving entity; and $B_{total}$ is the total number of bits of data transmitted, or, in other words, the length of the message in bits.

Assuming that the cost of compressing a particular message is $C_{comp}$, the power cost of transmitting the message via the second path, path 2, discussed above with reference to FIG. 3, can be described as:

$$C_{path2} = C_{comp} + (C_{trans/bit} \cdot B_{comp})$$

where $C_{comp}$ is the power cost for compressing the message; and $B_{comp}$ is the size of the compressed message.

Note that, in general, $C_{comp}$ is a function of $B_{total}$, but, as pointed out above, for the current discussion, a particular message being transmitted, $C_{comp}$ is assumed to have a particular value. The difference in power cost between path 1 and path 2, $\Delta C$, can be computed as follows:

$$\Delta C = C_{path1} - C_{path2} = \frac{C_{tran/bit} \cdot B_{total} - (C_{comp} + (C_{tran/bit} \cdot B_{comp}))}{(C_{tran/bit} \cdot (B_{total} - B_{comp})) - C_{comp}}$$

The value of $\Delta C$ is 0 when:

$$C_{tran/bit} \cdot (B_{total} - B_{comp}) = C_{comp}$$

The path difference $\Delta C$ is positive, referred to as the path-difference state $\Delta C+$, when:

$$C_{tran/bit} \cdot (B_{total} - B_{comp}) > C_{comp}$$

The path difference $\Delta C$ is negative, referred to as the path-difference state $\Delta C-$, when:

$$C_{tran/bit} \cdot (B_{total} - B_{comp}) < C_{comp}$$

The path-difference state $\Delta C+$ for a time period or quantity of data indicates that compression of the data prior to transmission leads to an over-all power-consumption reduction versus transmission of uncompressed data.

The cost of compression can be modeled in various ways. For example, the compression cost $C_{comp}$ may be considered to be a function of the amount of data to be compressed, $B_{total}$, and the amount of compressed data generated, $B_{comp}$:

$$C_{comp} = \alpha B_{total} + \beta B_{comp}$$

where $\alpha$ and $\beta$ are constants. Given the average compressibility ratio for the data within the block is $\gamma$, the compression cost can be expressed as a function of the amount of data to be compressed, $B_{total}$, as $$C_{comp} = (\alpha + \beta \gamma) B_{total}$$

Rather than comparing the above-discussed metric $C_{tran/bit} \cdot (B_{total} - B_{comp})$ with $C_{omp}$, the compressibility y can be compared to the ratio:

$$(C_{tran/bit} - \alpha)/(C_{tran/bit} + \beta)$$

in order to determine when to compress data prior to transmission and when to transmit uncompressed data.

Figure 4:
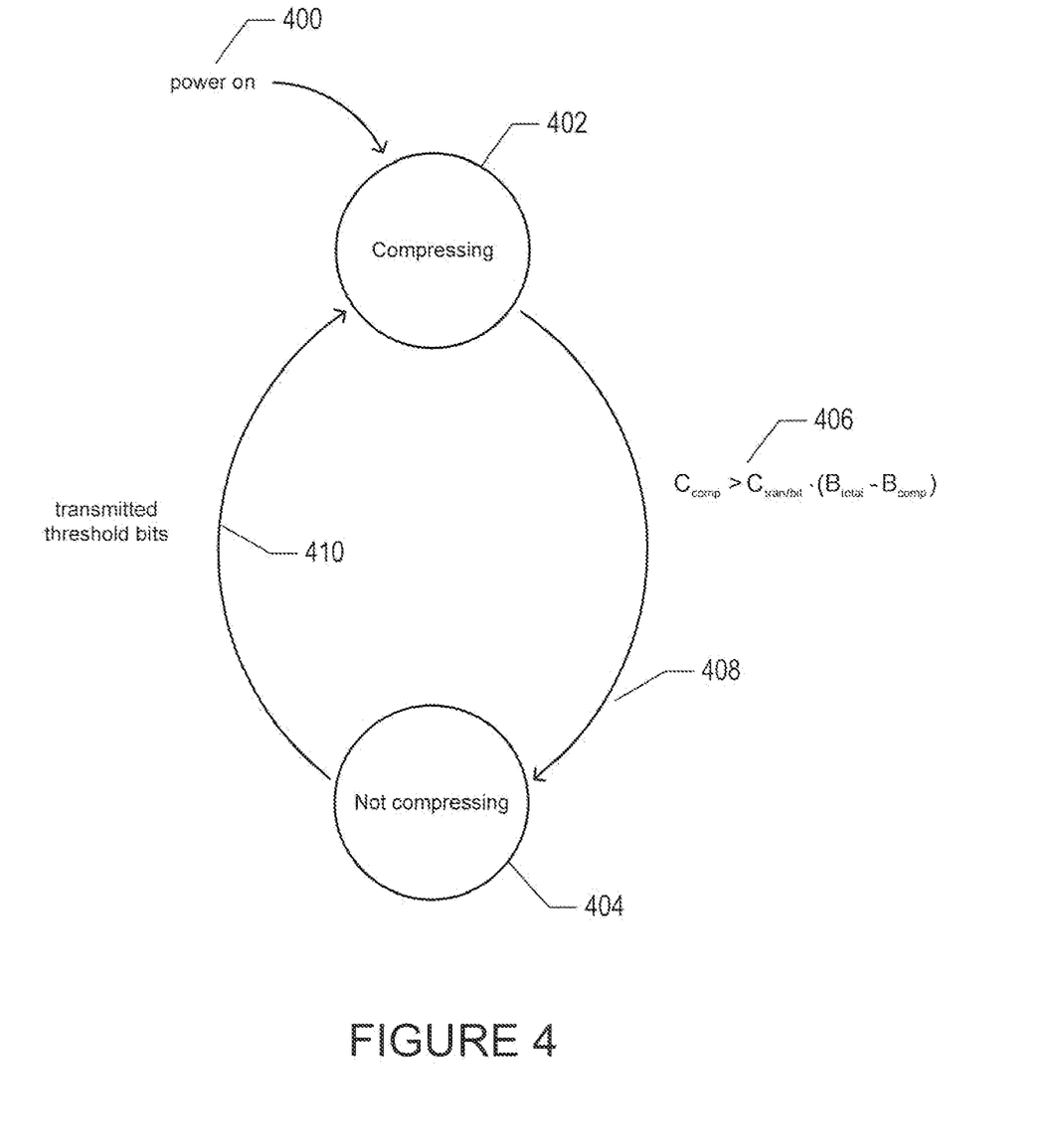
FIG. 4 shows a state-transition diagram for a two-state system for data transmission incorporated within certain embodiments of the present invention.

FIG. 4 shows a state-transmission diagram for a two-state system for data transmission incorporated within certain embodiments of the present invention. For example, a sensor, according to the state-transition diagram provided in FIG. 4, can occupy one of two sensor states: (1) a compressing state 402; and (2) a not-compressing state 404. When initially powered on 406, the sensor begins operation in the compressing state 402. During data transmission, the sensor monitors the parameters $C_{comp}$, $C_{tran/bit}$, and $B_{comp}$, and when $C_{comp} > C_{tran/bit} \cdot (B_{total} - B_{comp})$ 406 for a given block of data, indicating that the power-cost difference between path 1 and path 2, discussed above with reference to FIG. 3, is negative, or that the path-difference state is $\Delta C-$, then the sensor transitions from the compressing state 402, in which data compression is employed, to the not-compressing state 404, in which data compression is not employed 408. In the not-compressing sensor state, data is transmitted without compression until a threshold number of bits of data have been transmitted without compression, at which point the sensor transitions 410 back to the compressing state 402.

In other words, the sensor alternates between compressing data prior to transmission and transmitting data without compression, transitioning to transmitting data without compression when the sensor determines that compression is not currently power-cost effective. The sensor transmits data without data compression for some period of time, or, equivalently, transmitting some threshold amount of data, before transitioning back to the compressing sensor state, in which data is first compressed before being transmitted. In many implementations, the period of time for which data is transmitted without compression or the threshold amount of data transmitted without compression may be a variable, to reflect a recent history of data transmission, including the relative amounts of compressed data versus uncompressed data transmitted. Note that the method of the present invention embodied in the state-transition diagram FIG. 4 represents a data-transmission optimization strategy based on an estimate of when compression should be employed. It would be possible to always compress data, and when data compression proves to be inefficient, instead transmit uncompressed data. However, while this method would allow for portions of the data stream, or periods of time, during which compression is insufficiently effective to be precisely determined, the precise determination would be possible at the power cost of always compressing the data. In other words, the power cost of precisely determining when data compression is effective and when data compression is not effective would outweigh the power-consumption savings obtained by transmitting compressed data only when data-compression is effective.

Figure 5:
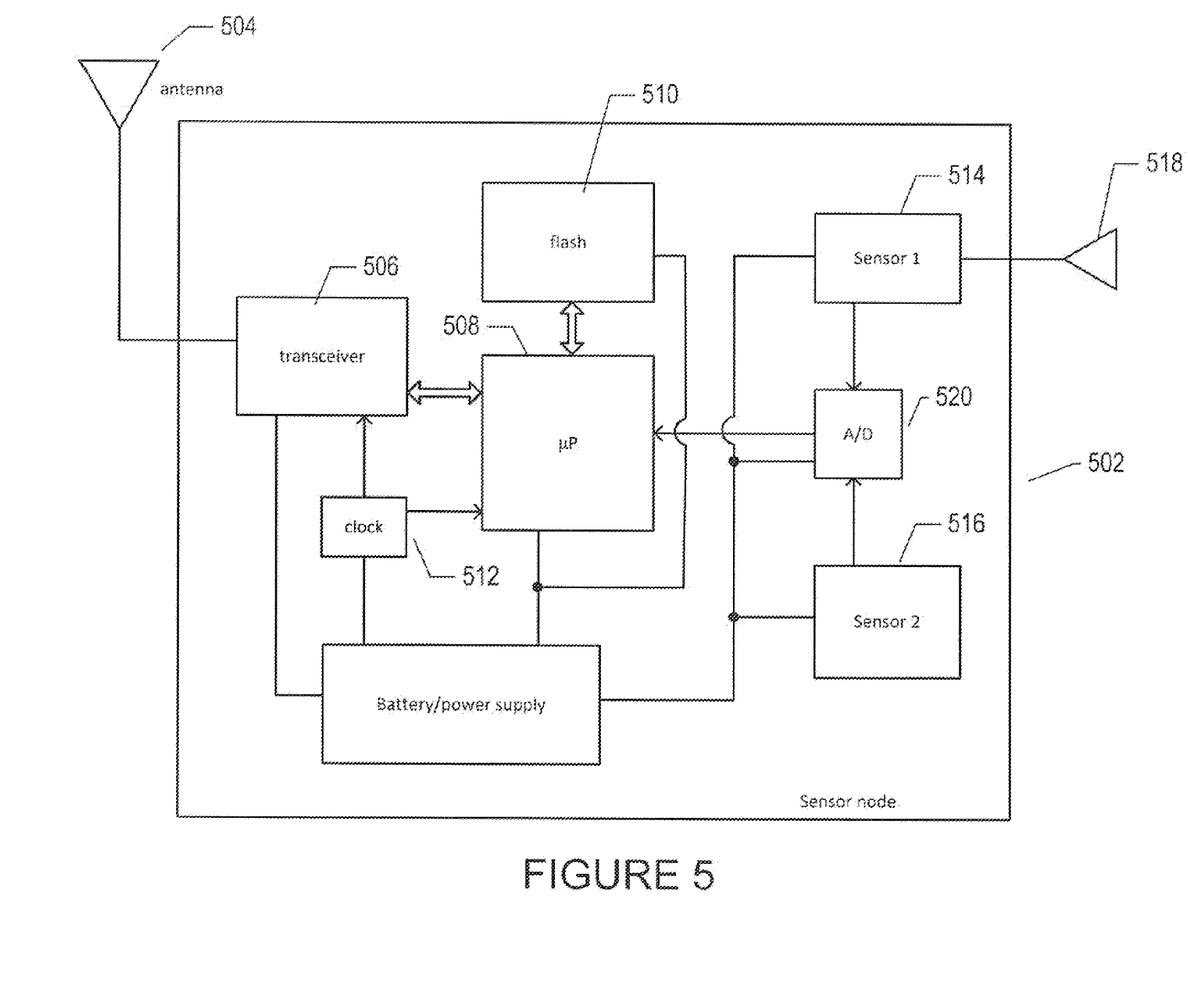
FIG. 5 illustrates internal components of an example, special-purpose sensor node.

Sensor nodes and sensor routers may be small computer systems, with internal components similar to those of the computer system shown below, in FIG. 6, and including additional peripheral sensors connected to the small computer by any of many different wire-based or wireless communications media. Alternatively, sensor nodes may be special-purpose, often low-power-consuming devices housed within robust enclosures resistant to environmental agents, including water, wind, mechanical abrasion, sunlight, and other environmental agents. FIG. 5 illustrates internal components of an example, special-purpose sensor node. The sensor node 502 receives messages from, and transmits messages to, a sensor router, remote computer, telecommunications station, or other remote entity via an external antenna 504 and internal transceiver 506, generally implemented as an integrated circuit. Operation of the sensor node is controlled by a microprocessor 508, which includes internal memory for storing executable routines and memory 510 for storing control programs, configuration information, and other such information to facilitate microprocessor control of the sensor node. The sensor node may include a separate clock 512 for synchronizing communications and other operations. A sensor node generally includes at least one, and often more, sensor devices 514 and 516. Sensor devices often produce analog signals that are converted to equivalent digital signals by an analog-to-digital converter 518 prior to input to the microprocessor 508. Certain sensors may include external sensing devices 518, such as temperature or pressure-measuring devices, while other sensor devices, such as sensor 516 in FIG. 5, may be internal, such as accelerometers.

Figure 6:
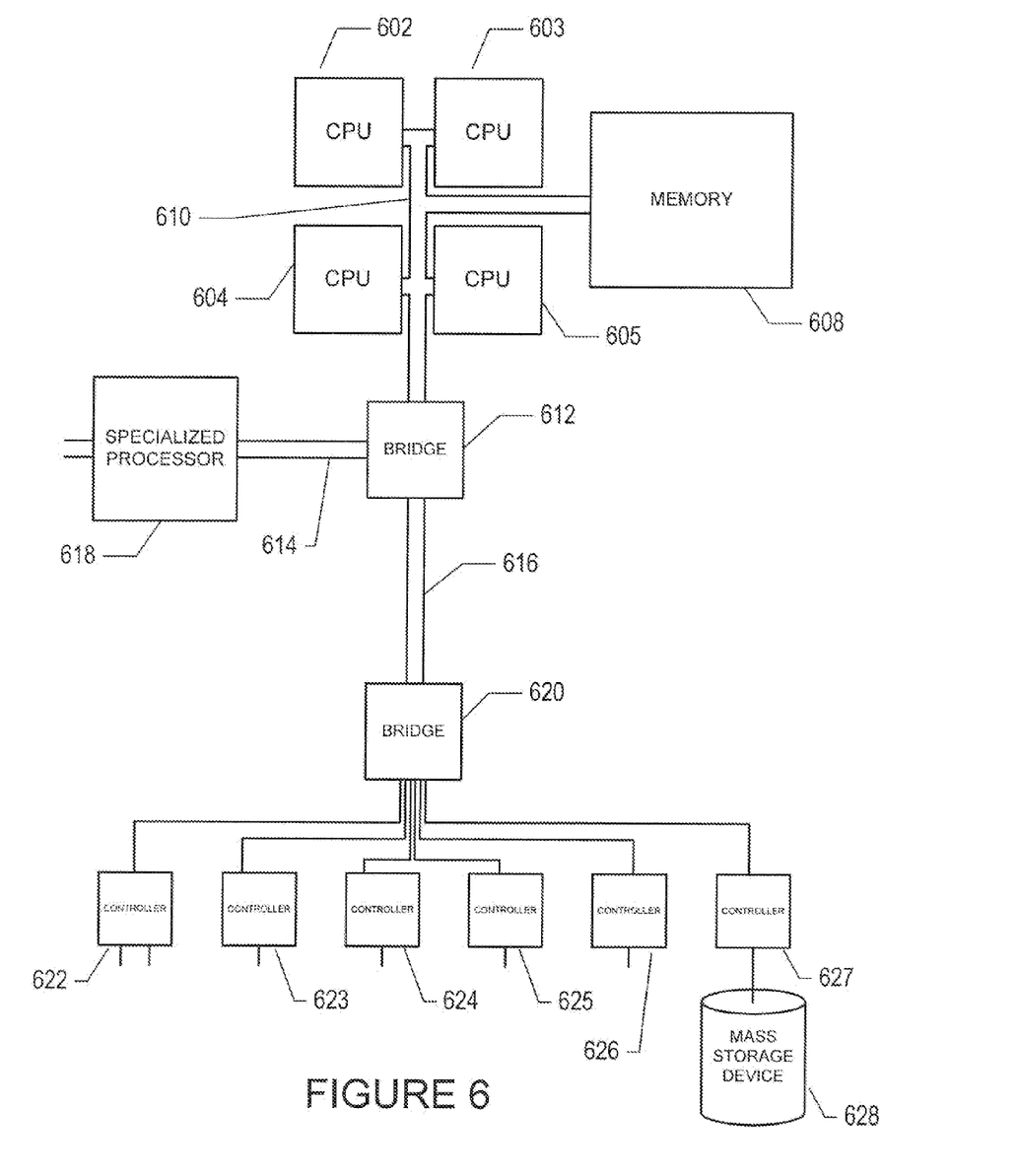
FIG. 6 illustrates a general-purpose computer system that, when executing a software-implemented data-transmission method for receiving data transmitted by sensors of a sensor network that incorporates selective-compression method embodiments of the present invention, comprises an embodiment of one component of a system embodiment of the present invention.

FIG. 6 illustrates a general-purpose computer system that, when executing a software-implemented data-transmission method for receiving data transmitted by sensors of a sensor network that incorporates selective-compression method embodiments of the present invention, comprises an embodiment of one component of a system embodiment of the present invention. The computer system contains one or multiple central processing units ("CPUs") 602-605, one or more electronic memories 608 interconnected with the CPUs by a CPU/memory-subsystem bus 610 or multiple busses, a first bridge 612 that interconnects the CPU/memory-subsystem bus 610 with additional busses 614 and 616, or other types of high-speed interconnection media, including multiple, high-speed serial interconnects. These busses or serial interconnections, in turn, connect the CPUs and memory with specialized processors, such as a graphics processor 618, and with one or more additional bridges 620, which are interconnected with high-speed serial links or with multiple controllers 622-627, such as controller 627, that provide access to various different types of mass-storage devices 628, electronic displays, input devices, and other such components, subcomponents, and computational resources. Software instructions that implement a multiple-source-data-compression-method embodiment of the present invention may be encoded and stored on any of various computer-readable media, including magnetic and optical disks and electronic memories. Embodiments of the present invention may also be implemented on distributed computer systems and can also be implemented partially or fully in hardware logic circuitry.

Method embodiments of the present invention are necessarily implemented for execution by computer systems and other electronic computing systems, since the method embodiments involve large numbers of complex logic and arithmetic operations that need to be carried out reliably at rates sufficient to process data concurrently generated by many data sources.

Next, a C++-like pseudocode implementation of one embodiment of the present invention is provided. First, an enumeration, a number of class declarations, and a constant are provided:

```
 1 enum State {COMPRESSING, NOT_COMPRESSING};
 2
 3 class data
 4 {
 5     public:
 6         int length( );
 7         data& operator=(const data& d);
 8 };
 9
10 class message
11 {
12     public:
13         message (State s);
14         void setState(State s);
15         bool addData(data& d);
16         bool room(data& d);
17         bool room( );
18 };
19
20 class transmitQ
21 {
22     public:
23         double getCost( );
24         void queue(message* m);
25 };
26
27 class inputQ
28 {
29     public:
30         bool empty( );
31         void wait( );
32         data& next( );
33         void deleteNext( );
34 };
35
36 int THRESHOLD ( );
```

The enumeration "State" includes the two states "COMPRESSING" and NOT_COMPRESSING," discussed above with reference to FIG. 5. The class "data," a declaration for which is provided on lines 3-8, represents a quantity of data that can be transmitted by a sensor to a receiving entity. The class "data" includes the following member functions: (1) "length," which returns the number of bits of data stored in an instance of the class "data;" and (2) an assignment operator. The class "message," a declaration for which is provided on lines 10-19, above, represents a data message transmitted from the sensor to a receiving entity. The class "message" includes the following function members: (1) a constructor "message"; (2) "setState," which sets a header field of the message to indicate the state of the sending sensor; (3) "addData," function member that adds a next quantity of data to the message, with each amount of data added to the message appropriately demarcated within the message or identified by header fields to allow each amount of data to be separately extracted by a receiving entity; (4) "room," which returns Boolean value indicating whether there is sufficient room in the data portion of the message to add the data represented by argument "d;" and (5) "room," a version of the member function "room" without arguments, that indicates whether or not there is any remaining available space in the message for additional data. The class "transmitQ," a declaration for which is provided on lines 20-25, represents a transmission queue to which messages are queued by a sensor for transmission to a receiving entity. The class "transmitQ" includes the following function members: (1) "getCost," a function which returns the current estimate of the power cost for transmitting a bit of data; and (2) "queue," a function called to queue a next message to the transmission queue represented by an instance of the class "transmitQ." The class "inputQ," a declaration for which is provided on lines 27-34, above, represents an input queue on which the sensor data-transmission routine, described below, receives data for transmission to a receiving entity. The class "inputQ" includes the following function members: (1) "empty," which returns a Boolean value to indicate whether or not there is any data available on the input queue; (2) "wait," a function called by the data-transmission routine to wait until data is available on the input queue; (3) "next," a function that returns a reference to the next quantity of data available on the input queue; and (4) "deleteNext," a function that deletes the next amount of available data on the input queue. Finally, on line 36, the function "THRESHOLD," discussed above with reference to FIG. 5, is declared. This function returns an amount of data to be transmitted without compression before again attempting to compress data. The value returned by this function may vary, over time, depending on monitored characteristics of data transmission and data compression, and may reflect a recent success rate for data compression. For example, when recent history shows frequent periods of successful data compression, the waiting period returned by THRESHOLD may be shorter than when successful data compression has been infrequent.

Next, an implementation of a sensor data-message-transmission routine, or handler, is provided:

```
 1 double compress(data& d1, data* d2);
 2
 3 void sensorMessageHandler (inputQ* IQ, transmitQ* TQ)
 4 {
 5     State state = COMPRESSING;
 6     double cost_compression = 0;
```

-continued

```
7    double cost_transmission_per_bit = 0;
8    data d;
9    message* m;
10   int totalLengthUncompressed = 0;
11   int totalLengthCompressed = 0;
12   int metric = 0;
13   bool alreadyCompressed = false;
14
15   while (true)
16   {
17     if (IQ->empty( )) IQ->wait( );
18     m = new message(state);
19
20     do
21     {
22       if (state == COMPRESSING)
23       {
24         metric = cost_transmission_per_bit *
25               (totalLengthUncompressed – totalLengthCompressed);
26         if (totalLengthCompressed == 0 ||
27             m->room (IQ->next( )) ||
28             metric >= cost_compression
29             )
30         {
31           if (alreadyCompressed) alreadyCompressed = false;
32           else
33           {
34             cost_compression += compress(IQ->next( ), &d);
35             if (d.length( ) > IQ->next( ).length( ))
36             {
37               state = NOT_COMPRESSING;
38               totalLengthUncompressed = 0;
39               break;
40             }
41           }
42           if (m->addData(d))
43           {
44             totalLengthCompressed += d.length( );
45             totalLengthUncompressed += IQ->next( ).length( );
46             IQ->deleteNext( );
47           }
48           else alreadyCompressed = true;
49         }
50         else
51         {
52           if (metric < cost_compression)
53           {
54             state = NOT_COMPRESSING;
55             totalLengthUncompressed = 0;
56           }
57           break;
58         }
59       }
60       else // state == NOT_COMPRESSING
61       {
62         if (m->addData(IQ->next( )))
63         {
64           totalLengthUncompressed += IQ->next( ).length( );
65           IQ->deleteNext( );
66         }
67         else break;
68       }
69
70     } while (!alreadyCompressed && !IQ->empty( ));
71
72     TQ->queue(m);
73     if (state == NOT_COMPRESSING &&
74         totalLengthUncompressed > THRESHOLD( ))
75     {
76       totalLengthUncompressed = 0;
77       totalLengthCompressed = 0;
78       cost_compression = 0;
79       cost_transmission_per_bit = TQ->getCost( );
80       state = COMPRESSING;
81     }
82   }
83 }
```

The routine "compress," declared on line 1, compresses the data described by argument "d1," into a data space described by argument "d2," returning a value indicating the power cost of compressing the data. The power cost may be estimated by the routine "compress" from the number of instructions executed, using system-like calls prior to, and following, data compression, or may estimate the power cost from the length and characteristics of the data. An implementation for this routine is not provided, as many different types of compression methods can be employed, according to embodiments of the present invention, and data compression itself is outside the scope of the present application. Implementations of the function members of the above-declared classes are also not provided, because most are straightforward and depend on each of numerous possible different implementations of the classes chosen for a particular implementation of the present invention. The member function "wait" of the class "inputQ" is operating-system or routine-execution-environment dependent, and therefore is not implemented in the current discussion, and the member function "getCost" for the class "transmitQ" depends on which of many different approaches are taken to estimate the power cost of data transmission, and therefore a specific implementation for the function member "getCost" is not provided. Note that the power cost of transmitting a bit of data, returned by the function member "getCost," may vary over time. For example, in a sensor environment in which many sensors suddenly attempt to simultaneously transmit messages to a receiving entity, many message collisions may occur, in which case the power cost of transmitting a bit of data would increase, reflecting the increased power cost attendant with multiple attempts to transmit a message until collision-free transmission is obtained. The power cost of data transmission may also fluctuate with the time of day, available stored and environmentally extracted power, and according to various other parameters and characteristics. The power cost of data transmission may be monitored and estimated empirically, in certain cases, or it may be estimated by any of various empirical formulas with variable parameters.

An implementation of the sensor data-message-transmission routine or handler is provided on lines 3-83, above. The routine takes, as arguments, pointers to a data input queue, "IQ," and a data-message transmission queue, "TQ." On lines 5-13, a number of local variables are declared: (1) "state," the current state of the sensor; (2) "cost_compression," the current, accumulated data-compression power cost, obtained from each call to the routine "compressed," which returns a value indicating the power cost of compressing a quantity of data; (3) "cost_transmission_per_bit," the currently estimated power cost of data transmission as returned by function "getCost" of the class "transmitQ"; (4) "d," storage space for a quantity of compressed data; (5) "m," a data message; (6) "totalLengthUncompressed," an accumulated total length of uncompressed data transmitted while in the current sensor state; (7) "totalLengthCompressed," an accumulated total length of compressed data transmitted while in the current sensor state; (8) "metric," a metric defined as "cost_transmission_per_bit*(totalLengthUncompressed−totalLengthCompressed," which is compared to the current, accumulated data-compression power cost to determine when to transition from the COMPRESSING state to the NOT_COMPRESSING state; and (9) "alreadyCompressed," a Boolean variable indicating that a quantity of already-compressed data is available for storing in the message currently being constructed, to allow the routine to use the already-compressed data in order to avoid the cost of recompressing the data.

In the while-loop of lines 13-83, the data-message-transmission routine continuously constructs and queues data messages for transmission to a receiving entity. In each iteration of the while-loop, a next data message is constructed and queued to the transmission queue. If the input queue is empty, as determined on line 17, then the routine invokes the inputQ function member "wait" in order to wait until data is available for transmission. Once data is available, a new message is allocated on line 18. Note that a bit or field in the data-message header is set, during data-message allocation, to indicate whether or not the data within the message is compressed, the value obtained from the argument passed to the constructor for the data message. The receiving entity thus learns, in advance of data processing, whether or not the data to be processed is compressed, and can therefore process the data appropriately, as discussed above with reference to FIG. 3. In the do-while loop of lines 20-70, a next message is constructed. If the current sensor state is "COMPRESSING," as determined on line 22, then, if no data has yet been compressed since the most recent transition to the COMPRESSING state, there is room to store the next available data from the input queue without compression in the message, or data compression is deemed to be justified as being more than offset by savings in data-transmission power costs, then the next amount of available data is compressed, on line 34, when no already-compressed data is available. If already-compressed data is available, as determined on line 31, then the variable "alreadyCompressed" is set to FALSE, to indicate that the already-compressed data has been consumed. If, following compression, the routine determines that the compressed data has a greater length than the uncompressed data, on line 35, then the sensor state is set to "NOT_COMPRESSING," on line 37, and the do-while loop is exited. Otherwise, a next amount of compressed data is attempted to be added to the message, on line 42, and; when successfully added, the data is deleted from the input queue and the totalLengthCompressed and totalLengthUncompressed variables are incremented by the length of data added to the message and the amount of data compressed, respectively, on lines 44-45.

There are a variety of methods by which multiple data sets can be included in a message so that the data sets can be subsequently extracted by a receiving entity. Each data set may be identified by a position and length, in a variable list of data-set parameters included in the message header, for example. Alternatively, the message header may contain a list of data-set pointers or indexes. The addData member function updates the message header appropriately for each amount of data added to a message via a call to the addData member function. If there was insufficient room within the message to add the next amount of compressed data, then the variable "alreadyCompressed" is set to TRUE, on line 48, so that this data can be added to a next message without recompression. If it has been determined not to add additional compressed data to the message, then if compression is no longer justified, as determined on line 52, the sensor state is set to "NOT_COMPRESSING" on line 54 and the do-while loop is exited. When the sensor state is "NOT_COMPRESSING," then the next amount of data available from the input queue is added to the message on line 62. If addition of the data is successful, then the variable "totalLengthUncompressed" is updated, on line 64, and the data is deleted from the input queue on line 65. Otherwise, the do-while loop is exited, on line 67.

Once a new message has been constructed, the message is queued to the transmission queue, on line 72. If the current sensor state is "NOT_COMPRESSING," and the total amount of data transmitted in this current sensor state exceeds the value returned by the function call "THRESHOLD( )," as determined on lines 73-74, then the cumulative length and compression power-cost variables are set to 0, on lines 76-78, a new cost-of-data-transmission value is obtained from the transmit queue, on line 79, and the current sensor state is set to "COMPRESSING" on line 80.

Although the present invention has been described in terms of particular embodiments, it is not intended that the invention be limited to these embodiments. Modifications will be apparent to those skilled in the art. For example, selective-compression data-transmission methods that represent embodiments of the present invention can be implemented in any of many different computer languages for use in many different electronic devices and systems by varying any of many implementation parameters, including operating-system platform, data structures, modular organization, control structures, and other such implementation parameters. Any of many different types of power-cost estimating functions can be used, including different function for estimating power cost for data transmission and power cost for compression. It should be noted that selective-compression data-transmission methods are necessarily carried out by software, firmware, logic-circuit, or hybrid firmware and logic-circuit implementation. While data is discussed as being incorporated into data messages for transmission, in the above discussion, data may be alternatively streamed to receiving entities by other means, in which case separate messages may be included in the stream to notify the receiving entity of sensor-state transitions.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A sensor comprising:
one or more sensing devices;
data-transmission components to transmit sensor data to a receiving entity; and
a processing component to execute routines to record sensing-device output as data for transmission to the receiving entity and to control the data-transmission components to transmit the data to the receiving entity,
wherein the processing component is to execute one or more compressing routines to compress data prior to transmission when data compression is estimated to result in a lower power cost than transmitting uncompressed data, and control the data-transmission components to transmit data without compressing the data when data compression is estimated to result in a higher power cost than transmitting uncompressed data, and
wherein, if the uncompressed data is transmitted from the data-transmission components to the receiving entity, the data-transmission components are to monitor an amount of the transmitted uncompressed data.

2. The sensor of claim 1 wherein the sensor operates, at any point in time, in either a compressing sensor state or a not_compressing sensor state.

3. The sensor of claim 2 wherein, while operating in the compressing state, the sensor compresses data prior to transmitting the data and monitors both the power cost of data compression and the power cost of transmitting compressed data.

4. The sensor of claim 3 wherein, while operating in the compressing state, the sensor evaluates whether a cost determined as the difference in amount of data between the received data and compressed data, since last transitioning to the compressing state, multiplied by the power cost of transmitting the data is less than the power cost of data compression, and, when the determined cost is less than the power cost of data compression, transitions to the not_compressing state.

5. The sensor of claim 3 wherein, while operating in the compressing state, the sensor evaluates whether or not to transition to the not_compressing state by comparing the compressibility of recently transmitted data to a ratio $$(C_{tran/bit}-\alpha)/(C_{tran/bit}+\beta)$$

wherein $C_{comp}$ is the cost of transmitting a bit of information, expressed as $$C_{comp}=\alpha B_{total}+\beta B_{comp}$$

and wherein $\alpha$ and $\beta$ are constants.

6. The sensor of claim 2 wherein, while operating in the not_compressing state, the sensor transmits uncompressed data.

7. The sensor of claim 6 wherein, while operating in the not_compressing state, the sensor evaluates whether the amount of uncompressed data transmitted since last transitioning to the not_compressing state exceeds a threshold amount of data and, when the amount of uncompressed data transmitted since last transitioning to the not_compressing state exceeds a threshold amount of data, transitions to the compressing state.

8. The sensor of claim 7 wherein the threshold amount of data is a value returned by a function.

9. The sensor of claim 8 wherein the function that returns the threshold amount of data considers a recent history of success for data compression, data-transmission characteristics, and data-compression characteristics to determine the returned value.

10. The sensor of claim 1 wherein data is included within data messages for transmission by the sensor.

11. A method for data transmission comprising:
while in a first data-transmission state "compressing," compressing data for transmission prior to transmitting compressed data;
while in a second data-transmission state "not_compressing," transmitting data for transmission without compressing the data for transmission;
selecting a next data-compression state to which to transition in order to reduce power consumption for data transmission; and
if operating in the not_compressing data-transmission state, monitoring an amount of the transmitted uncompressed data.

12. The method of claim 11 further including, while operating in the compressing data-transmission state, monitoring both the power cost of data compression and the power cost of transmitting compressed data.

13. The method of claim 12 further including, while operating in the compressing data-transmission state, evaluating whether a cost determined as the difference in amount of data between the received data and compressed data, since last transitioning to the compressing state, multiplied by the power cost of transmitting the data is less than the power cost of data compression, and, when the determined cost is less than the power cost of data compression, transitioning to the not_compressing state.

14. The method of claim 11 further including, while operating in the not_compressing data-transmission state, evaluating whether the amount of uncompressed data transmitted since last transitioning to the not_compressing state exceeds a threshold amount of data and, when the amount of uncompressed data transmitted since last transitioning to the not_compressing state exceeds a threshold amount of data, transitioning to the compressing state.

15. The method of claim 14 further including placing data within data messages for transmission.

16. A distributed sensor network comprising:
a sensor-data-receiving system; and
two or more sensors, wherein each sensor is to compress data prior to transmission to the sensor-data-receiving system when data compression is estimated to result in a lower power cost than transmitting uncompressed data and transmit uncompressed data to the sensor-data-receiving system when data compression is estimated to result in a higher power cost than transmitting uncompressed data
wherein, if the uncompressed data is transmitted from the two or more sensors to the sensor-data-receiving system, the two or more sensors are to monitor an amount of the transmitted uncompressed data.

17. The distributed sensor network of claim 16 wherein each sensor comprises:
one or more sensing devices;
data-transmission components that transmit sensor data to a receiving component; and
a processing component that executes routines to record sensing-device output as data for transmission to the sensor-data-receiving system and to control the data-transmission components to transmit the data to the sensor-data-receiving system.

18. The distributed sensor network of claim 17
wherein each sensor operates, at any point in time, in either a compressing sensor state or a not_compressing sensor state;
wherein, while operating in the compressing state, each sensor compresses data prior to transmitting the data and monitors both the power cost of data compression and the power cost of transmitting compressed data.

19. The distributed sensor network of claim of claim 18 wherein, while operating in the compressing state, the sensor evaluates whether a cost determined as the difference in amount of data between the received data and compressed data, since last transitioning to the compressing state, multiplied by the power cost of transmitting the data is less than the power cost of data compression, and, when the determined cost is less than the power cost of data compression, transitions to the not_compressing state.

* * * * *